United States Patent [19]

Henry et al.

[11] 3,806,776

[45] Apr. 23, 1974

[54] IMPROVEMENT FOR CONNECTING A TWO TERMINAL ELECTRONICAL DEVICE TO A CASE

[75] Inventors: Raymond Henry; Jacques Chelot, both of Paris, France

[73] Assignee: Thomson-CSF, Paris, France

[22] Filed: July 13, 1972

[21] Appl. No.: 271,354

[30] Foreign Application Priority Data

Aug. 20, 1971 France .......................... 71.30428

[52] U.S. Cl. ..... 317/234 R, 317/234 G, 317/234 L, 317/234 M

[51] Int. Cl. .......................... H01l 3/00, H01l 5/00

[58] Field of Search ............... 317/234, 1, 4, 5, 5.2, 317/5.3, 4.1

[56] References Cited

UNITED STATES PATENTS

| | | | |
|---|---|---|---|
| 2,572,801 | 10/1951 | Casellini | 317/234 X |
| 2,930,948 | 3/1960 | Eannarino et al. | 317/234 |
| 3,298,093 | 1/1967 | Cohen | 317/234 L |
| 3,621,442 | 11/1967 | Racht | 317/234 L |
| 3,673,478 | 6/1972 | Osoegawa et al. | 317/234 L |
| 2,735,050 | 2/1956 | Armstrong | 317/234 |
| 2,903,628 | 9/1959 | Giacoletto | 317/234 |
| 3,245,847 | 4/1966 | Pizzarello | 317/234 G |
| 3,280,382 | 10/1966 | Bendig | 317/234 G |
| 3,202,489 | 8/1965 | Bender et al. | 317/234 G |
| 3,257,588 | 6/1966 | Mueller | 317/234 G |
| 3,614,832 | 10/1971 | Chance et al. | 317/234 |
| 3,665,589 | 5/1972 | Farrell | 317/234 |

*Primary Examiner*—Andrew J. James
*Attorney, Agent, or Firm*—Cushman, Darby & Cushman

[57] ABSTRACT

A diode is first of all soldered by one of its faces to the stud of a case. Subsequently, a gold wire is soldered in the form of a nail head, by thermo-compression, to the other face of the diode and cut at a predetermined level. At the same time, an indium pill is soldered to a zone of the cover which is located opposite the diode. When the cover is applied to the stud, the gold wire pricks into the indium. A heat-treatment enables the indium to melt and wet the gold wire. The connection is thus established without creating any substantial parasitic inductance.

4 Claims, 2 Drawing Figures

IMPROVEMENT FOR CONNECTING A TWO TERMINAL ELECTRONICAL DEVICE TO A CASE

The present invention relates to a novel type of connection for respectively effecting electrical connection between each of the terminals of a semiconductor junction and each of the corresponding terminals of the case inside which said junction is arranged.

The invention relates, likewise, to methods of applying such connections.

The connections most often used currently take the form of strips or wires linking a terminal of the junction to one of the terminals of the case.

In this case, three soldered joints, are often required. The soldering of the strips or the wires to the junction, and two soldered connections to the cover of the case itself. This triple operation makes manufacture more difficult and increases the risks. These wires or strips also interfere with the proper execution of the etching, rinsing and varnishing operations carried out on the diode prior to the final closure of the case.

Finally, these wires or strips must be sufficiently fine and long to be flexible, thus not giving rise to any mechanical stresses. Unfortunately, because of this fact, they have substantial parasitic inductances.

However, where diodes of the P.I.N. type are concerned, for example, these being used in microwave power switching equipment, the value of these parasitic inductances must be reduced to a minimum.

An object of the present invention is to overcome these drawbacks and the invention relates to a novel type of connection which is easy to attach and creates no parasitic inductance.

The present invention will be better understood from a consideration of the following explanations and the attached figures in which.

Figure 1:
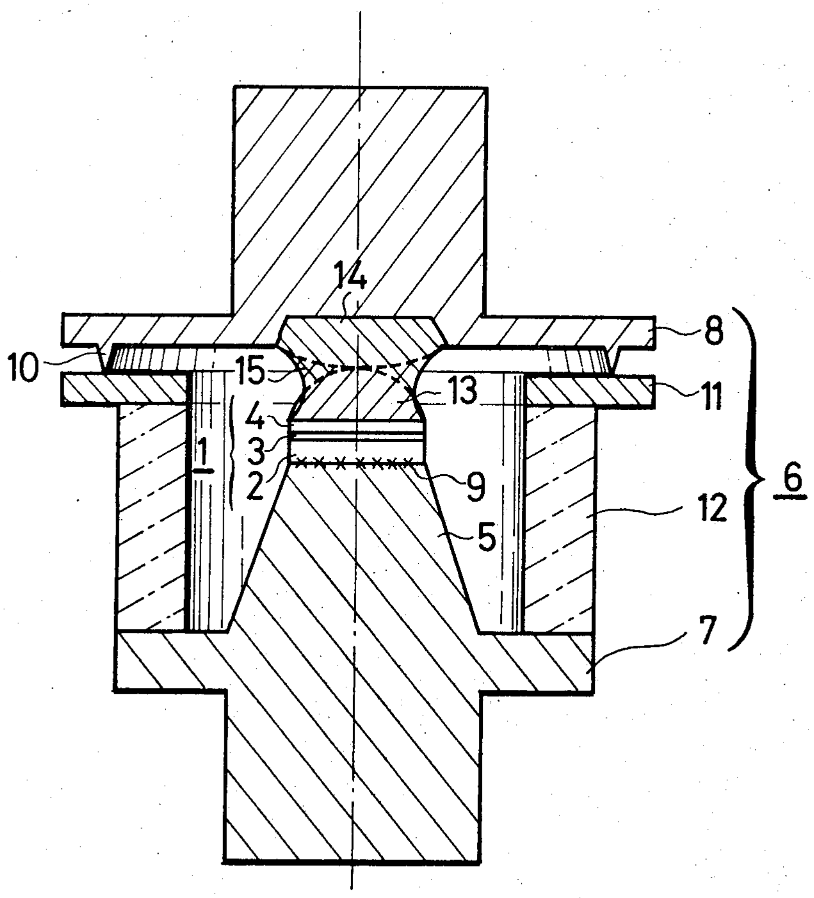
FIG. 1 is a schematic illustration of a first variant embodiment of the invention.

In FIG. 1, a junction semiconductor chip 1, constituting a diode which, by way of a non-limitative example, may for instance be a P.I.N. diode comprising respectively the P-type layer 2, the intrinsic layer 3, and the N-type layer 4, soldered to the stud 5 of a case 6. The soldering may be effected for example by an alloying bond 9. To produce this, the stud is covered with a material capable, at a relatively low temperature of forming an eutectic system with the semiconductor. In the case of a germanium and silicon diode, the stud can, for example, be made of copper covered with a gold deposit.

The case 6 is made up of two main parts, a receptacle carrying the stud 5, having a mounting flange 7 and a cover 8. This latter has a ridge 10 which enables better electric soldering of the two parts of the case to be effected by means of a collar 11 made of nickel-iron alloy. This collar is electrically insulated from the stud 5 by a hollow cylinder 12 of insulating material such as a ceramic.

In accordance with the invention, a pill 13 of a relatively soft material having a relatively low melting point, is deposited upon the metallized face of the semiconductor chip, which is opposite to that soldered to the stud 5. This kind of pill does not interfere with the proper execution of etching, rinsing and varnishing which the device has to undergo before being finally enclosed in the case.

A pill 14 of the same kind is deposited upon the cover of the case.

During the assembly operation, these two pills of soft metal, 13 and 14, are brought into contact with one another and a slight rise in temperature is sufficient to melt them so that in cooling, they take the form shown in FIG. 1 by the profile 15. After the closing of the case, the electrical connection between the junction and the cover is established by this mass of material which constitutes a short thick connection and one therefore which has a low parasitic inductance. Moreover, it facilitates the heat radiation which the junction may liberate during its operation. This first type of connection in accordance with the invention is applicable to diodes of relatively large size. Especially if smaller diodes are concerned, it is preferable to employ a second variant embodiment of the connection in accordance with the invention, however.

Figure 2:
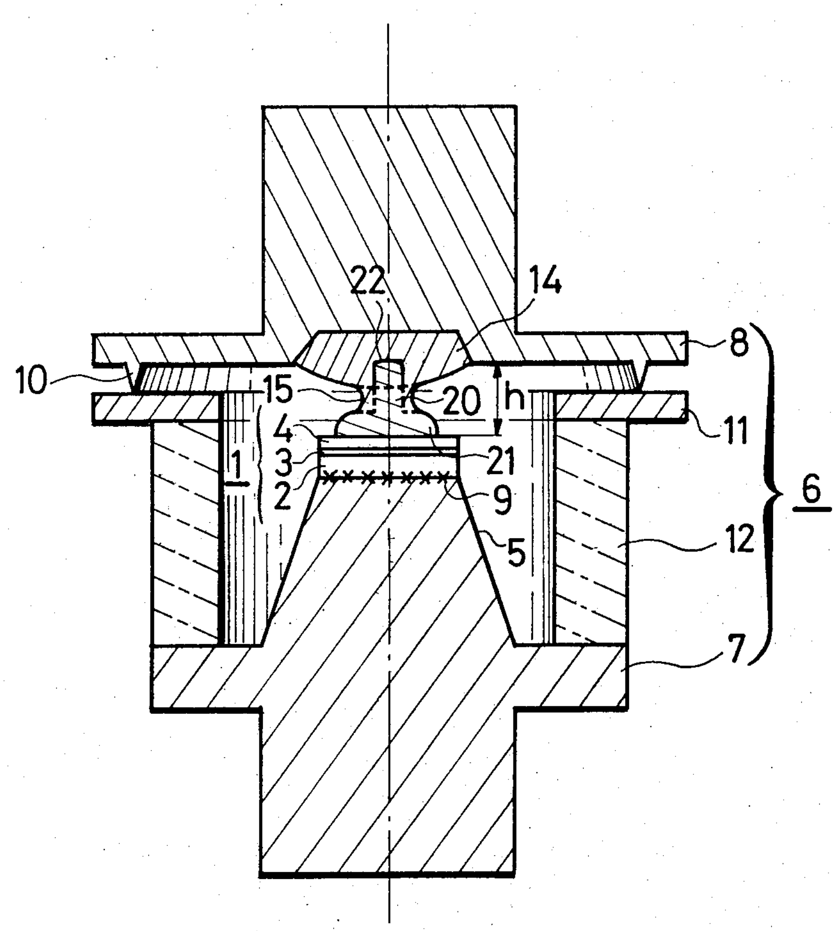
FIG. 2 is an illustration of a second variant embodiment of the invention.

FIG. 2 schematically illustrates said second variant embodiment. Similar elements are given similar references, in the two figures.

In accordance with this second embodiment, a pill 14 of a metal which is relatively soft at a temperature close to the ambient, is deposited upon the cover 8 of the case 6. On the other hand, a relatively hard metal wire 20 is soldered to the semiconductor chip 1. In a preferred embodiment of the invention, the soldering operation is effected by thermo-compression of the wire 20 one of the ends of which takes the form of a nail head 21. The other end 22 of the wire is then cut at a predetermined level *h*, either using a torch or by means of shears. The level *h* is a function of the manufacturing tolerances of the casing and upon the conditions of fitting and electric soldering of the cover 8, to the collar 11.

The presence of this wire 20, in view of its shape, presents no problem neither during etching and rinsing of the semiconductor chip, nor during the application of varnish which is normally made to the periphery of the junction.

During the installation of the diode in the case, the cover 8 is moved towards the mounting flange 7 and the wire 20 of hard metal pricks into the pill 14 of soft metal, as shown by the dotted line 22. If required, the system may be heated to the melting temperature of the soft metal 14 which latter then wets the wire 20 and, in cooling, adopts the configuration 15. It is therefore necessary to use for the soft conductive material a metal or alloy which has a relatively low melting point. This melting temperature should not, however, in any case, be less than the maximum operating temperature of the device. It is essential, on the other hand, to choose a soft material which has a good wetting coefficient in relation to the hard metal constituting the wire.

For example, the soft material may be indium or an alloy containing quite a large proportion of this metal, and the metal wire a gold wire.

The electrical connection is then effected between the diode and the case by means of a very short lead having a low parasitic inductance and whose fitting is a straight forward matter, this lead lending itself readily to the mass production of semiconductor devices.

What we claim is:

1. A solid state circuit component comprising a case, and a two terminal semiconductor device, having at least a first and a second superimposed region of opposite types of conductivity, said case comprising in combination a conductive cover, and a stud insulated from said cover: electrical connection for connecting said first region to said stud, and means for connecting said cover to said second region; said means comprising: a first pill of a relatively soft conductive material deposited on said cover, a metal layer deposited upon said second region and a body made of a second conductive material, having an hardness at least equal to that of said first material deposited upon said metal layer, said body penetrating inside said pill.

2. A component as claimed in claim 1, wherein said body is constituted by a second pill, said second material being capable, when melted, of wetting said first material.

3. A component as claimed in claim 1, wherein said body comprises a wire, said second material having a hardness substantially higher than that of said first metal.

4. A component as claimed in claim 3, wherein said first material is an indium alloy, said second material being gold.

* * * * *